United States Patent
Jeng et al.

(10) Patent No.: US 7,606,693 B2
(45) Date of Patent: Oct. 20, 2009

(54) CIRCUIT SIMULATION WITH DECOUPLED SELF-HEATING ANALYSIS

(75) Inventors: Min-Che Jeng, Cupertino, CA (US); Yutao Ma, San Jose, CA (US); Zhihong Liu, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 495 days.

(21) Appl. No.: 11/224,249

(22) Filed: Sep. 12, 2005

(65) Prior Publication Data

US 2007/0079205 A1 Apr. 5, 2007

(51) Int. Cl.
*G06F 17/50* (2006.01)
(52) U.S. Cl. ....................................................... 703/14
(58) Field of Classification Search .................... 703/14
See application file for complete search history.

(56) References Cited

U.S. PATENT DOCUMENTS

| | | | |
|---|---|---|---|
| 5,812,431 A | | 9/1998 | Kundert |
| 6,052,520 A | * | 4/2000 | Watts, III ..................... 703/10 |
| 6,151,698 A | | 11/2000 | Telichevesky et al. |
| 6,842,714 B1 | * | 1/2005 | Acar et al. .................. 702/136 |

OTHER PUBLICATIONS

R.P. Polkala et al., "Thermal analysis in SPICE", 1989, International Conference on Computer-Aided Design 1989, pp. 256-259.*

Stefan Wunsche et al., "Electro-Thermal Circuit Simulation Using Simulator Coupling", Sep. 1997, IEEE Transactions on very large scale integration systems, vol. 5, No. 3, pp. 277-282.*

Hermann G. Matthies et al., "Strong Coupling Methods", Sep. 2002, bib1lp1.rz.tubs.de/.../Document.pdf;jsessionid=0000IY2t6Plm7fcecvzFweuOwzE?hosts=local, pp. 1-30.*

Wim Van Petegem et al., "Electrothermal simulation and design of integrated circuits", Feb. 1994, IEEE Journal of solid-state circuits, vol. 29, No. 2, pp. 143-146.*

Carlos A. Felippa et al., "Partitioned analysis of coupled mechanical systems", 2001, Computer methods in applied mechanics and engineering, vol. 190, pp. 3247-3270.*

(Continued)

*Primary Examiner*—Paul L Rodriguez
*Assistant Examiner*—Russ Guill
(74) *Attorney, Agent, or Firm*—The Webb Law Firm

(57) ABSTRACT

A solution of a first set of equations of the time-varying electrical response of a circuit is determined between pairs of adjacent time points $t_i$ and $t_{i+1}$ based on predicted electrical responses of the devices at time point $t_{i+1}$ and as a function of the initial temperatures of the circuit devices at time point $t_i$. A solution of a second set of equations of the time-varying temperature responses of devices of the circuit is determined (1) after each iteration of the first set of equations and as a function thereof or (2) at each time point $t_{i+1}$ and as a function of the solution of the first set of equations at the time point to determine the corresponding temperature response of the circuit. The solutions of the first and second sets of equations at one or more of the points in time are displayed.

18 Claims, 3 Drawing Sheets

OTHER PUBLICATIONS

K.G. Nichols, T.J. Kazmierski, M. Zwolinski and A.D. Brown; "Techniques For Nonlinear Simulation-Overview Of Spice-Like Circuit Simulation Algorithms"; *IEE Proc.-Circuits Devices Syst.*, vol. 141, No. 4, Aug. 1994; pp. 242-250.

Herbert Bernstein; "Understanding The Spice Simulation Engine—An Explanation Of What Goes on Behind The Scene"; Design Solutions—Issue I, 2003; pp. 9-10.

* cited by examiner

CIRCUIT SIMULATION WITH DECOUPLED SELF-HEATING ANALYSIS

BACKGROUND OF THE INVENTION

1. Field of the Invention

The present invention relates to circuit simulation and, more particularly, to a method and apparatus for simulating the time-varying electrical response of circuit devices and the time-varying temperature response of the circuit devices.

2. Description of Related Art

Today's circuit designers have to rely on circuit simulation to verify the functionality of a circuit design. Accurate device models are necessary for obtaining accurate simulation results.

During operation of devices, the power dissipation of each device will cause it to heat up whereupon its operating temperature will be higher than the environmental temperature. The difference in temperature for each device depends on its operating condition, which may vary during operation.

Device temperature has a substantial effect on device behavior and, therefore, on in-circuit simulation results. The effect of device temperature on the device behavior is called self-heating.

Heretofore, circuit simulation treated the temperature of each device as another freedom just like node voltages. For example, in a MOSFET, without self-heating effect, there are three independent states, namely, Vgs, Vds and Vbs. Once these states have been provided to a device model, a circuit simulator can process the device model and calculate the terminal currents and charges as well as the derivatives of those currents and charges with respect to node voltages.

With self-heating, in addition to Vgs, Vds and Vbs, there is another state, namely, temperature. Now, the device behavior (current, charges and their derivatives) are determined for these four states. Thus, calculation of the derivatives of all the currents and charges with respect to temperature during model evaluation is also required.

One problem associated with circuit simulation that includes modeling of self-heating is the need to derive the derivatives of all the outputs (currents/charges) and intermediate variables with respect to temperature. For many circuits determining the derivatives of all the outputs and intermediate variables with respect to temperature can be a large task. To this end, many circuit simulators include no self-heating support because the effort to calculate the derivatives of the outputs and their intermediate variables with respect to temperature is simply too big.

Another problem associated with circuit simulators that support modeling of self-heating, is that, due to bugs, or non-complete derivatives, the self-heating model is not well-developed and often causes convergence problems during simulation. This is a common problem for popular bipolar junction transistor circuit simulation models.

Still yet another problem is that the need to derive derivatives of all the outputs and intermediate variables with respect to temperature increases the amount of time required to perform a circuit simulation over a circuit simulator that does not support self-heating.

What is, therefore, needed, and not disclosed in the prior art, is a method and apparatus for performing a circuit simulation that overcomes the above problems and others.

SUMMARY OF THE INVENTION

The present invention is a circuit simulation method and apparatus which supports self-heating but eliminates the necessity of calculating temperature related derivatives of outputs and intermediate variables. It also avoids the need to derive the equation of the derivatives of the outputs and intermediate variables, and the need to incorporate these equations into the circuit simulator.

Essentially, the method and apparatus of a present invention updates the temperature of the devices only between different time steps during transient simulation, which does not require the derivatives with respect to temperature. This is in contrast to the conventional circuit simulation wherein the temperature is updated during each Newton-Raphson iteration, whereupon full derivatives with respect to temperature are required for the Newton-Raphson iteration to converge. The present invention makes use of the fact that the time scale of temperature changes of an electrical circuit is much larger than the electrical changes of the circuit.

The present invention is a circuit simulation method comprising (a) defining for a circuit a first set of non-linear equations of the time-varying electrical responses of the devices of the circuit; (b) defining for the circuit a second set of non-linear equations of the time-varying temperature responses of the circuit devices; (c) determining initial, DC electrical responses of the circuit devices and initial temperatures of the circuit devices; (d) predicting a solution of the first set of equations of the time-varying electrical responses of the circuit devices based on the electrical responses of the circuit devices determined in step (c); (e) solving the first set of equations of the time-varying electrical responses of the circuit devices utilizing an iterative solution technique that causes the first set of equations to convergence to the predicted solution thereby determining updated electrical responses of the circuit devices, wherein: each iteration of the iterative solution technique determines electrical responses of the circuit devices as a function of the temperatures of the circuit devices at the commencement of the iterative solution technique; and the electrical responses determined in one iteration of the iterative solution technique are utilized as the starting electrical responses for the next iteration of the iterative solution technique until the iterative solution technique converges whereupon the electrical responses of the circuit devices that caused said convergence are deemed to be the updated electrical responses of the circuit devices; (f) solving the second set of equations of the time-varying temperature responses of the circuit devices to determine updated temperatures of the circuit devices, the second set of equations solved (1) after each iteration of the first set of equations in step (e) and as a function of the electrical responses of the circuit devices determined thereby or (2) after convergence of the first set of equations to the solution predicted in step (d) and as a function of the updated electrical responses of the circuit devices; and (g) displaying for each of one or more of the circuit devices (1) at least one of the electrical response(s) and/or (2) the updated electrical response(s) thereof.

The method can further include: (h) predicting another solution of the first set of equations based on the updated electrical responses of the circuit devices in step (e); and (i) repeating steps (e)-(f) for the other predicted solution. Steps (h) and (i) can be repeated, as necessary, until a predetermined stop criteria has been satisfied.

The initial electrical responses of the circuit devices and initial temperatures of the circuit devices can be determined for a starting point in time. The solution in step (d) can be predicted for a time step ahead of the starting point in time. Each solution in step (h) can be predicted for a time step ahead of the point in time associated with the most recently determined updated electrical responses of the circuit devices in step (e).

Desirably, each iteration of the iterative solution technique of step (e) determines derivative(s) of all the terminal currents of the circuit devices. More specifically, each derivative determines a current into a terminal of a device or a charge at said terminal.

The first set of equations can be of the form:

$$f_1\left(x1_n, (1/h_n)\sum_{r=0}^{k} a1_r x1_{n-r}, x2_{n-1}, t_n\right) = 0$$

where n=time point number; $h_n$=time step between time $t_n$ and time $t_{n-1}$; $a1_r$=rational function of $h_n$ for x1—for up to k of the preceding values of time step n; $x1_{n-r}$ and $x1_n$=state vectors of circuit variables (excluding temperatures of circuit devices); and $x2_{n-1}$=temperatures of the circuit devices.

The second set of equations can be of the form:

$$f_2\left(x2_n, (1/h_n)\sum_{r=0}^{k} a2_r x2_{n-r}, x1_n, t_n\right) = 0$$

where n=time point number; $h_n$=time step between time $t_n$ and time $t_{n-1}$; $a2_r$=rational function of $h_n$ for x1—for up to k of the preceding values of time step n; $x1_n$=state vector of circuit variables (excluding temperatures of circuit devices); and $x2_n$ and $x2_{n-r}$=temperatures of the circuit devices.

The invention is also a computer system for automatically determining the time-varying electrical and temperature responses of devices of a circuit. The invention includes means for storing a first set of non-linear equations of the time-varying electrical responses of devices of a circuit and a second set of non-linear equations of the time-varying temperature responses of the circuit devices; means for storing initial electrical responses of the circuit devices and initial temperatures of the circuit devices for a point in time $t_0$; means for storing predicted electrical responses of the circuit devices at each of a plurality of points in time after $t_0$. Means is/are provided for iteratively solving the first set of equations between each pair of adjacent points in time $t_i$ and $t_{i+1}$ based on the predicted electrical responses of the circuit devices at the point in time $t_{i+1}$ and as a function of the temperatures of the circuit devices at the commencement of the iterative solution between each pair of adjacent points in time $t_i$ and $t_{i+1}$ such that each iterative solution converges, wherein i=0, 1, 2, ..., x and x=a desired number of points in time. Means is/are provided for solving the second set of equations (1) after each iteration of the first set of equations and as a function thereof or (2) at each point in time after $t_0$ and as a function of the solution of the first set of equations that resulted in the iterative solution converging at said point in time to determine the corresponding temperature responses of the circuit devices. Lastly, means is/are provided for displaying for at least one of the points in time the solutions of the first and second sets of equations at said point in time.

The starting electrical responses of the circuit devices for each iterative solution of the first set of equations between each pair of adjacent points in time include: (1) for adjacent points in time $t_0$ and $t_1$, the initial electrical responses or; (2) for adjacent points in time $t_i$ and $t_{i+1}$, the electrical responses determined for point in time $t_i$ from the iterative solution for adjacent points in time $t_{i-1}$ and $t_i$.

The first set of equations can be iteratively solved via the Newton-Raphson method. The first set of equations can include equations for the currents into the terminals of the circuit devices and/or the charges at the nodes of the circuit.

The invention is also a circuit simulation method that comprises: (a) storing in a computer memory for a circuit comprised of a plurality of interconnected circuit devices a first set of non-linear equations of the time-varying electrical responses of the circuit devices and a second set of non-linear equations of the time-varying temperature responses of the circuit devices; (b) in the computer memory, initializing the value of a variable n=0; (c) storing in the computer memory for a time $t_n$ initial, DC electrical responses of the circuit devices ($x1_n$) and initial temperatures of the circuit devices ($x2_n$); (d) in the computer memory, incrementing the value of the variable n by 1; (e) storing in the computer memory predicted electrical responses of the circuit devices ($x1_n$) for time $t_n$; (f) solving with a processing means the first set of non-linear equations for $x1_n$ utilizing a Newton-Raphson iteration method until said iteration method converges; (g) following step (f), solving with the processing means the second set of non-linear equations for $x2_n$; and (h) repeating steps (d)-(g) until $t_n = t_{stop}$, wherein $t_{stop}$ is a predetermined time after $t_0$.

In step (f), the first set of non-linear equations can be solved as a function of the temperatures of the circuit devices at the commencement of the Newton-Raphson iteration method. In step (g), the second set of non-linear equations can be solved as a function of the solution of the first set of non-linear equations that caused the first set of non-linear equations to converge in step (f).

The circuit simulation method can include causing a display means to display at least one solution of step (f) and/or at least one solution of step (g).

Lastly, the invention is a circuit simulation method comprising: (a) storing in a computer memory for a circuit comprised of a plurality of interconnected circuit devices a first set of non-linear equations of the time-varying electrical responses of the circuit devices and a second set of non-linear equations of the time-varying temperature responses of the circuit devices; (b) in the computer memory, initializing the value of a variable n=0; (c) storing in the computer memory for a time $t_n$ initial, DC electrical responses of the circuit devices ($x1_n$) and initial temperatures of the circuit devices ($x2_n$); (d) in the computer memory, incrementing the value of the variable n by 1; (e) storing in the computer memory predicted electrical responses of the circuit devices ($x1_n$) for time $t_n$; (f) solving with a processing means a single iteration of a Newton-Raphson iteration method on the first set of non-linear equations for $x1_n$; (g) as a function of the solution in step (e), solving with a processing means a single iteration of the Newton-Raphson iteration method on the second set of non-linear equations for $x2_n$; (h) repeating steps (f) and (g) until the solution of the Newton-Raphson iteration method on the first set of non-linear equations converges; (i) repeating steps (d)-(h) until $t_n = t_{stop}$, wherein $t_{stop}$ is a predetermined time after $t_0$.

In each iteration of step (f), the first set of non-linear equations can be solved as a function of the temperatures of the circuit devices at the commencement of the Newton-Raphson iteration method. In each iteration of step (g), the second set of non-linear equations can be solved as a function of the solution of the first set of non-linear equations in the immediately preceding iteration of step (f).

The circuit simulation method can include causing a display means to display at least one solution of step (f) and/or at least one solution of step (g).

DETAILED DESCRIPTION OF THE INVENTION

The present invention is a computer implemented method of simulating the response of an electrical circuit, such as an electronic circuit, wherein the changing temperatures of the devices comprising the circuit can be simulated at the same time the electrical performance of the circuit is simulated. More specifically, the present invention reduces the time required to perform simulation of the combined electrical response and temperature response of the circuit over prior art methods of circuit simulation while, at the same time, enabling the temperature responses of the devices comprising the circuit to be determined accurately. The present invention will now be described with reference to the accompanying figures where like reference numbers correspond to like elements.

Figure 1:
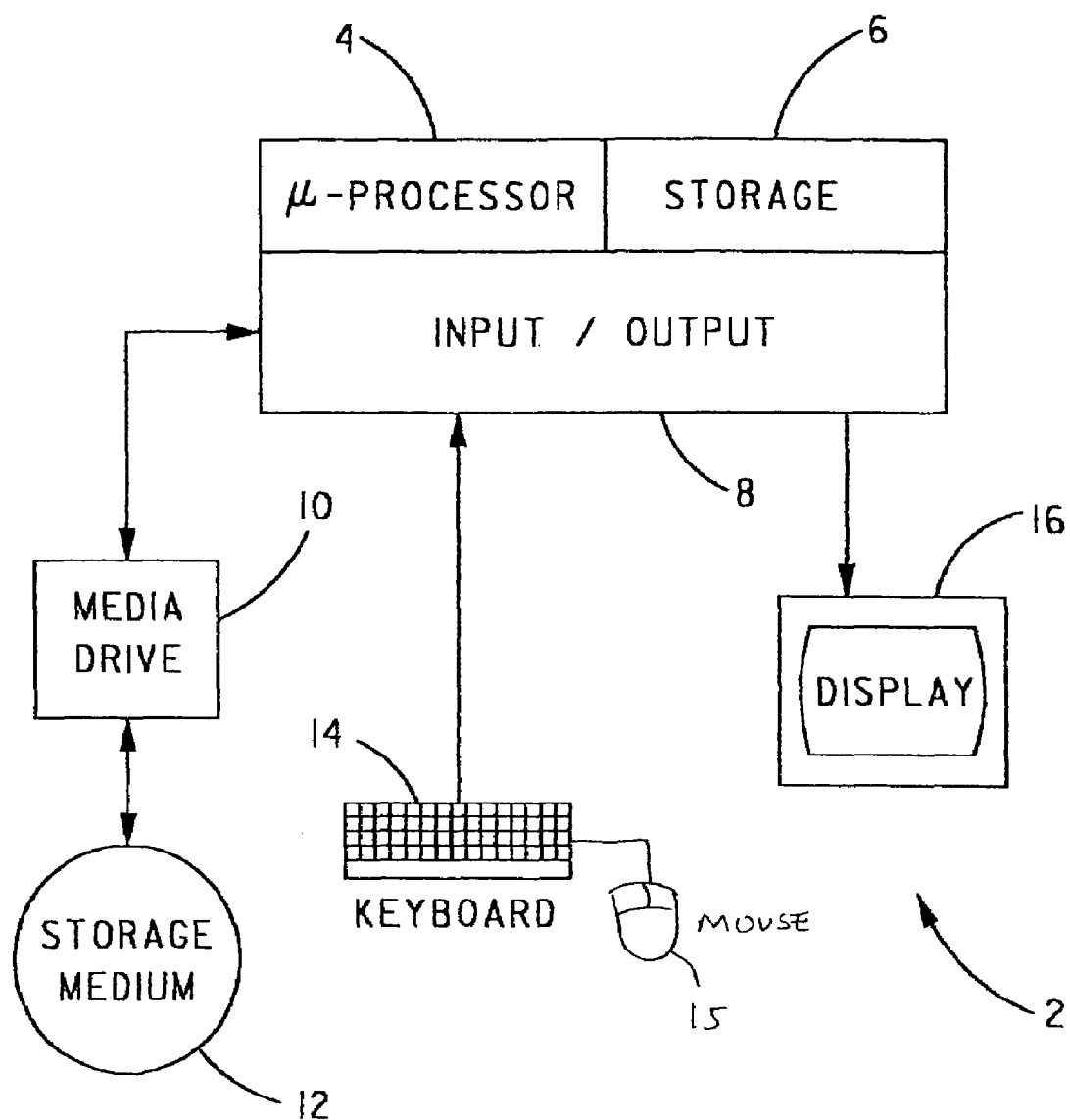
FIG. 1 is a block diagram of an exemplary computer or workstation that can be utilized to implement the present invention.

With reference to FIG. 1, the computer implemented method of the present invention is embodied in computer software which operates on a computer system 2 in a manner known in the art. Computer system 2 includes a microprocessor 4, a storage or memory 6 and an input/output system 8. Computer system 2 can also include a media drive, such as a disk drive, CD ROM drive, and the like. Media drive may operate with a computer usable storage medium 12 capable of storing the computer readable program code comprising the computer software which embodies the present invention, which computer readable program code is able to configure and operate computer system 2 in a manner to implement the present invention. Input/output system 8 may operate with a keyboard 14; a mouse 15 and/or a display 16. Output means other than display 16, such as a printer (not shown), may also be provided. Computer system 2 is exemplary of computer systems capable of executing the computer software which embodies the present invention and is not to be construed in any manner as limiting the invention.

By way of background, the goal of circuit simulation is to solve a first order differential algebraic equation of the form:

$$f(x(t), x'(t), t) = 0 = \text{(non-linear vector function)} \quad \text{EQ1}$$

where $x(t)$=state vector of circuit variables to be solved;

$x'(t)$=derivative of vector of circuit variables $x(t)$ with respect to time $t$.

The following finite difference formulation can be utilized to approximate the time derivative $x'(t)$ in EQ1:

$$x'(t_n) \equiv x'_n = (1/h_n) \sum_{r=0}^{k} a_r x_{n-r} \quad \text{EQ2}$$

where $h_n$=time step in advancing to discretized time point $t_n$ from discretized time point $t_{n-1}$; and $a_r$=rational functions of $h_n$—for up to k of the preceding values of time step.

Substituting $x'_n$ from EQ2 into EQ1 yields the following equation EQ3:

$$f\left(x_n, (1/h_n) \sum_{r=0}^{k} a_r x_{n-r}, t_n\right) = 0 \quad \text{EQ3}$$

EQ3 represents a group or set of non-linear algebraic equations. More specifically, equation EQ3 is the generalized form of a group of non-linear algebraic equations that typically need to be solved utilizing the well-known Newton-Raphson iteration method. The use of EQ3 and the Newton-Raphson iteration method will now be described.

A predicted solution $x^0_n$ of the state vector of the circuit variables at time point $t_n$ is substituted for $x_n$ in EQ3 to yield the following equation EQ4:

$$f\left(x^0_n, (1/h_n) \sum_{r=0}^{k} a_r x_{n-r}, t_n\right) = f^0 \quad \text{EQ4}$$

If the solution of $f^0$ in EQ4 is not zero, which is usually the case, the Newton-Raphson iteration method is utilized to solve for $x_n$ by the following equation EQ5, which is the linearized form of EQ4:

$$x_n^{i+1} = x_n^i - f^i * \left(\frac{\partial f}{\partial x_n}\right)^{-1} \text{ where } \frac{\partial f}{\partial x_n} \quad \text{EQ5}$$

is a $(m+p-1) \times (m+p-1)$ matrix;

m=the number of nodes in the circuit;

n=time point number;

p=the number of devices in the circuit that experience self-heating during operation of the circuit; and $f$=a set of $(m+p-1)$ equations representing the total currents flowing into $(m-1)$ independent nodes of the circuit and the p number of circuit devices that experience self-heating.

For example, if the solution of $f^0$ in EQ4 for time point $t_0$, i.e., n=1, is not zero, EQ5 is solved for i=0 by calculating the derivatives of all the terminal currents of the devices in the circuit with respect to the $(m-1)$ independent node voltages and the temperatures of the p number of circuit devices that experience self-heating. Then, EQ5 is solved iteratively, with the value of i being incremented by 1 before each iteration, until the difference of $x^{i+1}_n$ and $x^i_n$ is smaller than a predetermined tolerance.

The process of solving EQ4 and, as necessary, EQ5 is then repeated for a plurality of time points $t_1, t_2$, etc., (i.e., for n=2, 3, etc.) between time points $t_0$ and $t_{stop}$, where the interval of time between time points $t_0$ and $t_{stop}$ is the total time interval over which the circuit simulation is performed.

In the foregoing conventional implementation, each temperature is treated as a state in the equation just like a node voltage. Accordingly, it is necessary to derive all the derivatives of the terminal currents and node charges with respect to temperature, and the simulator has to perform extra calculations to solve for the temperature derivatives during circuit simulation.

In accordance with the present invention, however, the present inventors have observed that device temperature is not necessarily a normal state, like node voltage, during circuit simulation. More specifically, the present inventors have observed, in accordance with the present invention, that each terminal current and node charge for the circuit devices involved are required to be updated during each Newton-Raphson iteration, while it is not necessary to update the temperature of each device during Newton-Raphson iteration. Accordingly, instead of solving equation 3, the following equations EQ6A and EQ6B are solved for the time-varying electrical responses of the devices of the circuit and the time-varying temperature responses of the circuit devices, respectively.

$$f_1\left(x1_n, (1/h_n)\sum_{r=0}^{k} a1_r x1_{n-r}, x2_{n-1}, t_n\right) = 0 \quad \text{EQ6A}$$

$$f_2\left(x2_n, (1/h_n)\sum_{r=0}^{k} a2_r x2_{n-r}, x1_n, t_n\right) = 0 \quad \text{EQ6B}$$

where n=time point number;

$h_n$=time step between time $t_{n-1}$ and time $t_n$;

$a1_r$=rational function of $h_n$ for $x1$—for up to k of the preceding values of time step n;

$a2_r$=rational functions of $h_n$ for $x2$—for up to k of the preceding values of time step n; and $x1_{n-r}$ and $x1_n$=state vectors of circuit variables (excluding temperatures of circuit devices); and $x2_{n-r}$, $x2_{n-1}$ and $x2_n$=temperatures of the circuit devices.

$x1_n$ and $x2_n$ in EQ6A and EQ6B are parts of $x_n$ in EQ3, with $x1_n$ representing the normal states like node voltages, and with $x2_n$ representing the temperatures of the circuit devices. The linearized form of EQ6A (not shown) has the same general form as EQ5. However, in the linearized form of EQ6A, $$\frac{\partial f}{\partial x_n}$$

is a (m−1)×(m−1) matrix, e.g., a 10×10 matrix, where m=the number of nodes in the circuit, and $f$=a set of (m−1) equations representing the total currents flowing into the (m−1) independent nodes of the circuit. Similarly, the linearized form of EQ6B (not shown) has the same general form as EQ5. However, in the linearized form of EQ6B, $$\frac{\partial f}{\partial x_n}$$

is a p×p matrix, e.g., a 10×10 matrix, where p=the number of devices in the circuit that experience self-heating during operation of the circuit, and $f$=a set of p equations representing the temperatures of the circuit devices that experience self-heating during operation of the circuit.

With reference to the flowchart of FIG. 2, a first method of solving equations EQ6A and EQ6B in accordance with the present invention will now be described. Commencing from start step 20, the method advances to step 22 wherein a first set of non-linear equations in the form of EQ6A of the time-varying electrical response (x1) of the circuit devices comprising the circuit is generated and a second set of non-linear equations in the form of EQ6B of the time-varying temperature response (x2) of the circuit devices are generated.

The method then advances to step 24 wherein an initial DC electrical response of the circuit devices ($x1_0$) and initial temperatures of the circuit devices ($x2_0$) at time $t_0$ are determined.

In steps 26 and 28, variables n and i are respectively initialized to 1. Herein, n=time step number and i=iteration number. In step 30 solutions for $x1_n$ and $x2_n$ at time $t_n$ are predicted based on experience.

The method then advances to step 32 wherein the Newton-Raphson iteration method is executed to solve for $x1_n$. More specifically, the device states and their derivatives are calculated with respect to (w.r.t.) $x1_n^i$. Then, the solution for $x1_n^{i+1}$ is determined by the linearized form of equation EQ6A which determines, for i=1, the node voltages of the circuit, based on the initial temperatures of the devices, represented in EQ6A by $x2_{n-1}$. Once the solution for $x1_n^{i+1}$ has been determined, the solution for $x2_n^{i+1}$ is determined by the linearized form of equation EQ6B which determines, for i=1, the temperatures of the circuit devices based on the immediately preceding solution of $x1_n^{i+1}$. Background regarding the Newton-Raphson iteration method, a.k.a. the Newton method, can be found in U.S. Pat. Nos. 5,812,431 and 6,151,698, which are incorporated herein by reference.

The method then advances to step 34 wherein a determination is made whether the Newton-Raphson iteration has converged for both (1) $x1_n^i$ and $x1_n^{i+1}$ and (2) $x2_n^i$ and $x2_n^{i+1}$. If not, the method advances to step 36 wherein the value of i is incremented by 1 to obtain an updated value for i. Thereafter, the method returns to step 32 wherein the Newton-Raphson iteration method is once again executed for the updated value of i.

Steps 32, 34 and 36 are repeated iteratively until, in an instance of step 34, it is determined that both (1) $x1_n^i$ and $x1_n^{i+1}$; and (2) $x2_n^i$ and $x2_n^{i+1}$ have converged. When this occurs, the method advances to step 38.

In step 38, a determination is made if $t_n$ is greater than or equal to $t_{stop}$. If not, the method advances to step 40 wherein the value of time step n is incremented by one (1) to obtain an updated value for n. Thereafter, steps 28-40 are repeated as necessary for each updated value of time step n until it is determined in an instance of execution of step 38 that $t_n$ is greater than or equal to $t_{stop}$, whereupon the method advances to stop step 41 and execution of the method shown in FIG. 2 terminates.

Figure 2:
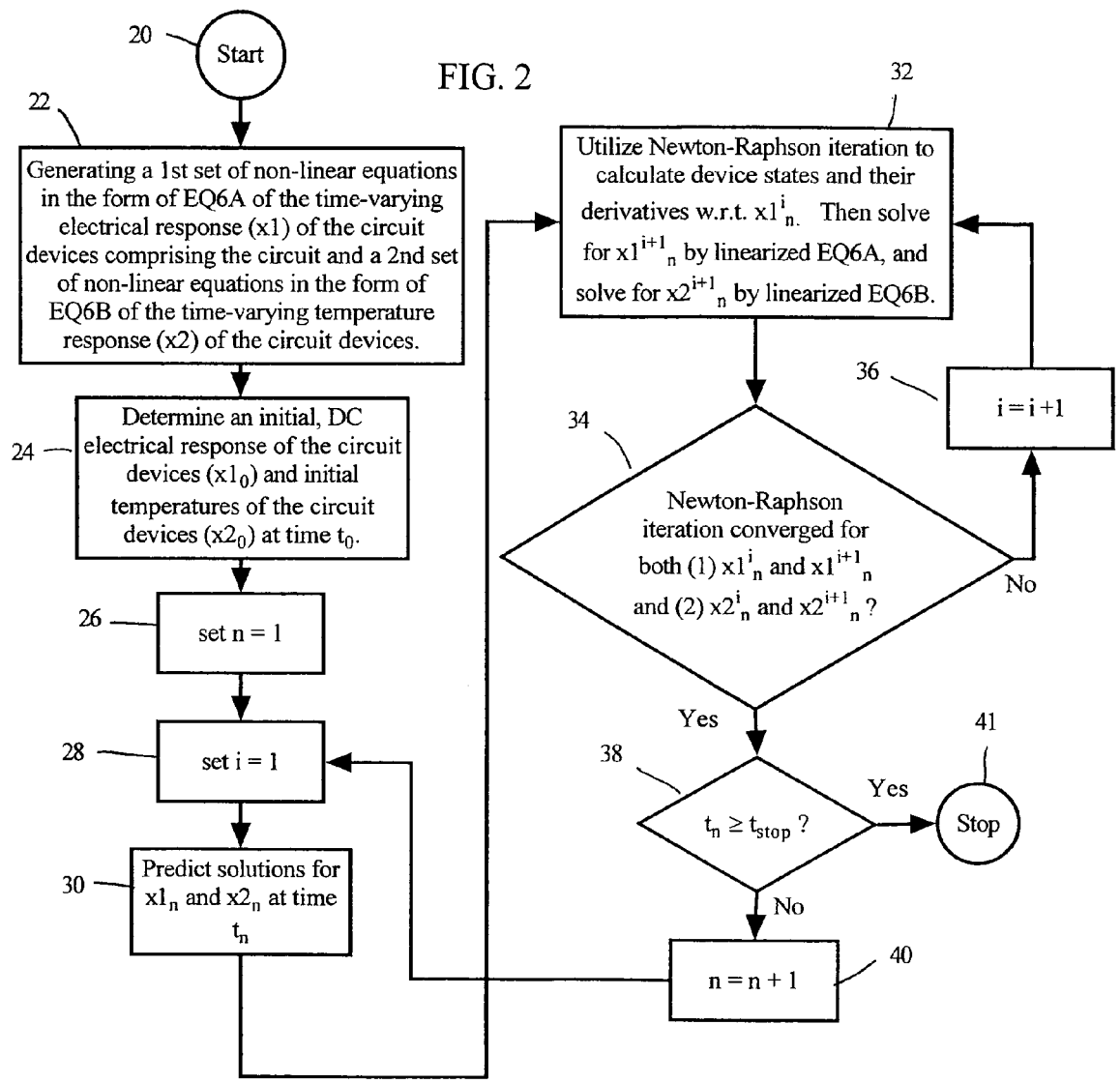
FIG. 2 is a flow diagram of a method in accordance with a first embodiment of the present invention.

In the embodiment of the invention shown in FIG. 2, the calculation of the time-varying electrical response of a circuit device is decoupled from the calculation of the time-varying temperature response of the circuit devices. Although the time-varying electrical response and the time-varying temperature response of the circuit devices are decoupled, the time-varying temperature responses of the circuit devices is determined in step 32 following each Newton-Raphson iteration of the solution of the time-varying electrical response of the circuit devices. By decoupling the time-varying temperature responses of the circuit devices from the time-varying electrical response of the circuit devices in this manner, the necessity to calculate the derivatives of the temperature responses of the circuit devices is avoided.

Figure 3:
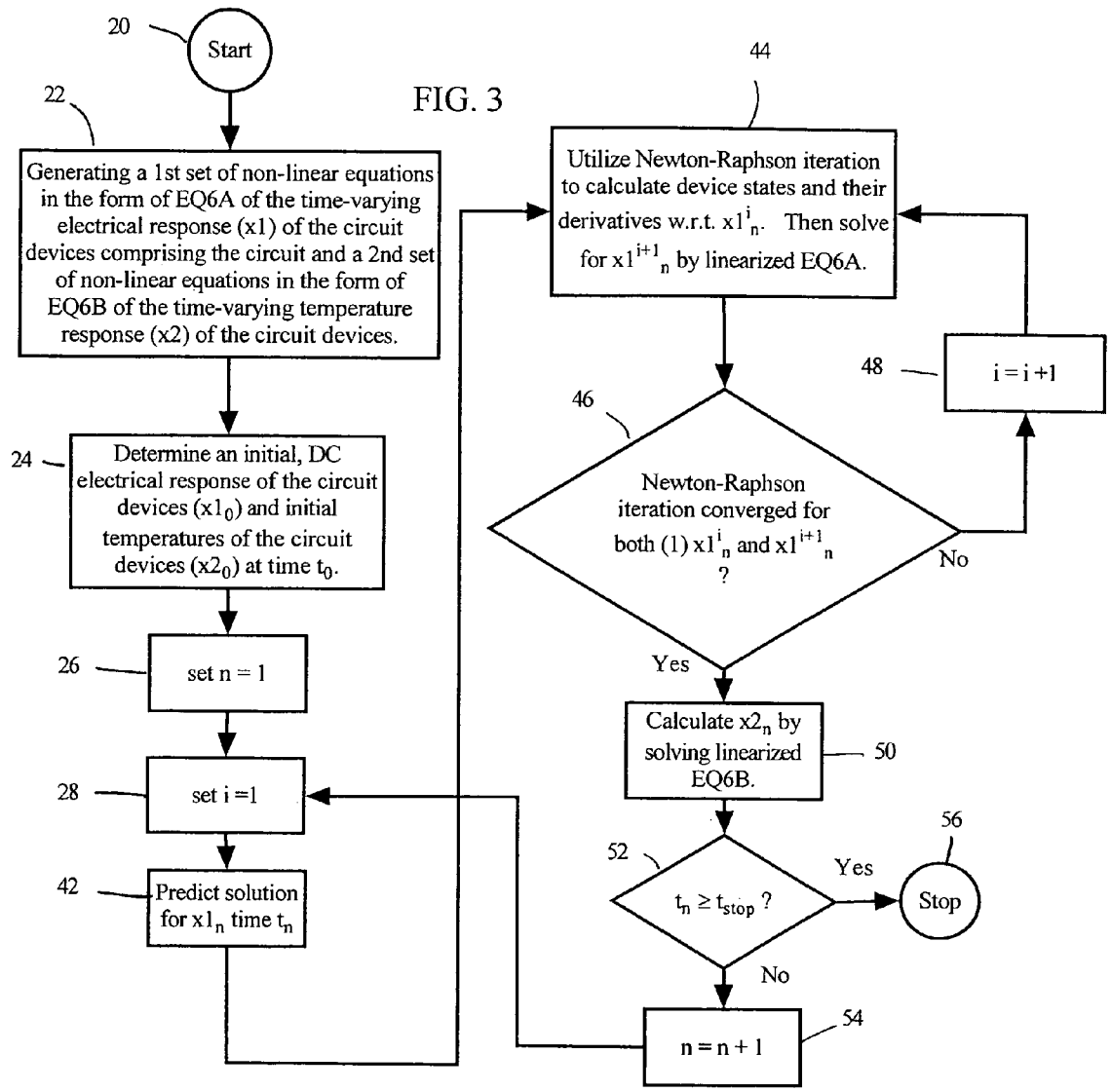
FIG. 3 is a flow diagram of a method in accordance with the a second embodiment of the present invention.

With reference to the flowchart in FIG. 3, a method in accordance with another embodiment of the present invention will now be described. In FIG. 3, steps 20-28 are the same as like numbered steps 20-28 in FIG. 2. Accordingly, details regarding steps 20-28 in FIG. 3 will not be described herein to avoid unnecessary redundancy.

Upon completion of step 28 in the flowchart of FIG. 3, the method advances to step 42 wherein a solution of the time-varying electrical response of the circuit devices $x1_n$ at time $t_n$ is predicted empirically. The method then advances to step 44 which performs the Newton-Raphson iteration method only on the time-varying electrical response of the circuit devices. Specifically, in step 44, the states of the circuit devices and their derivatives are calculated with respect to $x1^i_n$. Then, the solution of $x^{i+1}_n$ is determined by the linearized form of equation EQ6A.

The method then advances to step 46 wherein a determination is made if the Newton-Raphson iteration method has converged for $x1^1_n$ and $x1^{i+1}_n$. If not, the method advances to step 48 wherein the value of i is incremented by 1 to obtain an updated value of i. From step 48 the method returns to step 44 wherein another iteration of the Newton-Raphson iteration method is executed for the updated value of i.

Steps 44, 46 and 48 are repeated as necessary until in one iteration of step 46 it is determined that the Newton-Raphson iteration method has converged for $x1^i_n$ and $x1^{i+1}_n$ whereupon the method advances to step 50.

In step 50, the time-varying temperature responses of the circuit devices ($x2_n$) for the current value of n is calculated by solving the linearized form of equation EQ6B. The method advances to step 52 wherein a determination is made whether $t_n$ is greater than or equal to $t_{stop}$. If not, the method advances to step 54 wherein the value of n is incremented by one to obtain an updated value of n. Thereafter, steps 28 and 42-54 are repeated as necessary until, in an instance of step 50, $t_n$ is greater than or equal to $t_{stop}$, whereupon the method advances to stop step 56 and execution of the method terminates.

In the embodiment of the method shown in FIG. 3, the time-varying temperature response of the circuit devices is only updated at the end of each time point $t_n$, rather than during the Newton-Raphson iteration, to solve for the time-varying electrical response of the circuit devices between time points $t_{n-1}$ and $t_n$.

As can be seen, the present invention utilizes an iterative solution technique to iteratively determine updated electrical responses and updated temperature responses of one or more circuit devices based on the electrical responses and the temperatures of the one or more circuit devices at the beginning of each iteration. At one or more suitable times during and/or after execution of the iterative solution technique, the electrical response(s), the updated electrical response(s), the temperature response(s) and/or the updated temperature response(s) of the circuit devices can be output or displayed by any suitable and desirable means, such as a video display, a printout via a printer, etc., in any suitable and desirable manner that facilitates analysis of the electrical and temperature responses of the circuit devices to electrical stimulation.

In the embodiment of computer system 2 shown in FIG. 1, microprocessor 4 can be utilized for solving any of the foregoing equations while computer memory 6 can be utilized for storing any of the foregoing equations, any of the constants used in any of the foregoing equations as well as any variables generated during the solution of any of the foregoing equations. However, this is not to be construed as limiting the invention since the various elements of computer system 2 can be utilized in any suitable and desirable manner known in the art to implement the present invention.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A computer-implemented circuit simulation method comprising:
    (a) defining in a computer memory for a circuit a first set of non-linear equations of time-varying electrical responses of devices of the circuit;
    (b) defining in the computer memory for the circuit a second set of non-linear equations of time-varying temperature responses of the circuit devices;
    (c) storing in the computer memory initial, DC electrical responses of the circuit devices and initial temperatures of the circuit devices;
    (d) storing in the computer memory a predicted solution of the first set of equations of the time-varying electrical responses of the circuit devices based on the electrical responses of the circuit devices determined in step (c);
    (e) utilizing the most recently predicted solution of the first set of equations as a starting point, solving with a processor of the computer the first set of equations of the time-varying electrical responses of the circuit devices utilizing an iterative solution technique that causes the first set of equations to converge to a new solution of the updated electrical responses of the circuit devices, wherein:
        each iteration of the iterative solution technique determines electrical responses of the circuit devices as a function of temperatures of the circuit devices at the commencement of the iterative solution technique; and
        the electrical responses determined in one iteration of the iterative solution technique are utilized as the starting electrical responses for the next iteration of the iterative solution technique until the iterative solution technique converges whereupon the electrical responses of the circuit devices that caused said convergence are deemed to be the updated electrical responses of the circuit devices;
    (f) solving once with the processor a linearized form of the second set of equations of the time-varying temperature responses of the circuit devices to determine updated temperatures of the circuit devices, the second set of equations solved as a function of the new solution of the updated electrical responses of the circuit devices determined in step (e); and
    (g) causing a display means to display for each of one or more of the circuit devices (1) at least one of the electrical response and/or (2) the updated electrical response(s) thereof.

2. The method of claim 1, further including:
    (h) storing in the computer memory another predicted solution of the first set of equations based on the updated electrical responses of the circuit devices in step (e); and
    (i) repeating steps (e)-(f) for the other predicted solution.

3. The method of claim 2, further including repeating steps (h) and (i) until a predetermined stop criteria has been satisfied.

4. The method of claim 2, wherein:
    the initial electrical responses of the circuit devices and initial temperatures of the circuit devices are determined for a starting point in time;
    the solution in step (d) is predicted for a time step ahead of the starting point in time; and each solution in step (h) is predicted for a time step ahead of the point in time associated with the most recently determined updated electrical responses of the circuit devices in step (e).

5. The method of claim 1, wherein each iteration of the iterative solution technique of step (e) determines derivative(s) of all terminal currents of the circuit devices.

6. The method of claim 5, wherein each derivative determines a current into a terminal of a device or a charge at said terminal.

7. The method of claim 1, wherein the first set of equations is of the form:

$$f_1\left(x1_n, (1/h_n)\sum_{r=0}^{k} a1_r x1_{n-r}, x2_{n-1}, t_n\right) = 0$$

where n=time point number;
$h_n$=time step between time $t_n$ and time $t_{n-1}$;
$a1_r$=rational function of $h_n$ for x1—for up to k of the preceding values of time step n;
$x1_{n-r}$ and $x1_n$=state vectors of circuit variables (excluding temperatures of circuit devices); and
$x2_{n-1}$=temperatures of the circuit devices.

8. The method of claim 1, wherein the second set of equations is of the form:

$$f_2\left(x2_n, (1/h_n)\sum_{r=0}^{k} a2_r x2_{n-r}, x1_{n-1}, t_n\right) = 0$$

where n=time point number;
$h_n$=time step between time $t_n$ and time $t_{n-1}$;
$a2_r$=rational functions of $h_n$ for x2—for up to k of the preceding values of time step n; and
$x2_{n-r}$ and $x2_n$=temperatures of the circuit devices; and
$x1_n$=state vectors of circuit variables (excluding temperatures of circuit devices).

9. A computer system for automatically determining the time-varying electrical and temperature responses of devices of a circuit comprising:
means for storing a first set of non-linear equations of the time-varying electrical responses of devices of a circuit and a second set of non-linear equations of the time-varying temperature responses of the circuit devices;
means for storing initial electrical responses of the circuit devices and initial temperatures of the circuit devices for a point in time $t_0$;
means for storing predicted electrical responses of the circuit devices at each of a plurality of points in time after $t_0$;
means for iteratively solving the first set of equations between each pair of adjacent points in time $t_i$ and $t_{i+1}$ based on the predicted electrical responses of the circuit devices at the point in time $t_{i+1}$ and as a function of the temperatures of the circuit devices at the commencement of the iterative solution between each pair of adjacent points in time $t_i$ and $t_{i+1}$ such that each iterative solution converges, wherein i=0, 1, 2, . . . , x and x=a desired number of points in time;
means for solving a linearized form of the second set of equations once at each point in time after $t_0$ and as a function of the solution of the first set of equations that resulted in the iterative solution converging at said point in time to determine the corresponding temperature responses of the circuit devices at said point in time; and
means for displaying for at least one of the points in time the solutions of the first and second sets of equations at said point in time.

10. The computer system of claim 9, wherein starting electrical responses of the circuit devices for each iterative solution of the first set of equations between each pair of adjacent points in time include: (1) for adjacent points in time $t_0$ and $t_1$, the initial electrical responses or; (2) for adjacent points in time $t_i$ and $t_{i+1}$, the electrical responses determined for point in time $t_i$ from the iterative solution for adjacent points in time $t_{i-1}$ and $t_i$.

11. The computer system of claim 9, wherein the first set of equations is iteratively solved via the Newton-Raphson method.

12. The computer system of claim 9, wherein the first set of equations includes equations for currents into terminals of the circuit devices and/or charges at nodes of the circuit.

13. A computer-implemented circuit simulation method comprising:
(a) storing in a computer memory for a circuit comprised of a plurality of interconnected circuit devices a first set of non-linear equations of time-varying electrical responses of the circuit devices and a second set of non-linear equations of time-varying temperature responses of the circuit devices;
(b) in the computer memory, initializing the value of a variable n =0;
(c) storing in the computer memory for a time $t_n$ initial, DC electrical responses of the circuit devices ($x1_n$) and initial temperatures of the circuit devices ($x2_n$);
(d) in the computer memory, incrementing the value of the variable n by 1;
(e) storing in the computer memory predicted electrical responses of the circuit devices ($x1_n$) for time $t_n$;
(f) utilizing the most recently predicted solution of $x1_n$ in step (e) as a starting point, solving with a processing means the first set of non-linear equations for $x1_n$ utilizing a Newton-Raphson iteration method until said iteration method converges;
(g) following step (f), solving once with the processing means a linearized form of the second set of non-linear equations for $x2_n$;
(h) repeating steps (d)-(g) until $t_n=t_{stop}$, wherein $t_{stop}$ is a predetermined time after $t_0$; and
(i) causing a display means to display at least one solution of step (f) and/or at least one solution of step (g).

14. The circuit simulation method of claim 13, wherein, in step (f), the first set of non-linear equations is solved as a function of the temperatures of the circuit devices at the commencement of the Newton-Raphson iteration method.

15. The circuit simulation method of claim 13, wherein, in step (g), the linearized form of the second set of non-linear equations is solved as a function of the solution of the first set of non-linear equations that caused the first set of non-linear equations to converge in step (f).

16. A computer-implemented circuit simulation method comprising:
(a) storing in a computer memory for a circuit comprised of a plurality of interconnected circuit devices a first set of non-linear equations of time-varying electrical responses of the circuit devices and a second set of non-linear equations of time-varying temperature responses of the circuit devices;
(b) in the computer memory, initializing the value of a variable n =0;

(c) storing in the computer memory for a time $t_n$ initial, DC electrical responses of the circuit devices ($x1_n$) and initial temperatures of the circuit devices ($x2_n$);

(d) in the computer memory, incrementing the value of the variable n by 1;

(e) storing in the computer memory predicted electrical responses of the circuit devices ($x1_n$) for time $t_n$;

(f) utilizing the most recently predicted solution of $x1_n$ in step (e) as a starting point, solving with a processing means plural iterations of a Newton-Raphson iteration method on the first set of non-linear equations for $x1_n$ until a solution of the Newton-Raphson iteration method on the first set of non-linear equations converges;

(g) as a function of the solution in step (f), solving once with a processing means a linearized form of the second set of non-linear equations for $x2_n$;

(h) repeating steps (d)-(g) until $t_n = t_{stop}$, wherein $t_{stop}$ is a predetermined time after $t_0$; and (i) causing a display means to display at least one solution of step (f) and/or at least one solution of step (g).

17. The circuit simulation method of claim 16, wherein, in each iteration of step (f), the first set of non-linear equations is solved as a function of the temperatures of the circuit devices at the commencement of the Newton-Raphson iteration method.

18. The circuit simulation method of claim 16, wherein, in each iteration of step (g), the second set of non-linear equations is solved as a function of the solution of the first set of non-linear equations in the immediately preceding iteration of step (f).

* * * * *

UNITED STATES PATENT AND TRADEMARK OFFICE
CERTIFICATE OF CORRECTION

PATENT NO. : 7,606,693 B2  Page 1 of 1
APPLICATION NO. : 11/224249
DATED : October 20, 2009
INVENTOR(S) : Jeng et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 675 days.

Signed and Sealed this

Twelfth Day of October, 2010

David J. Kappos
*Director of the United States Patent and Trademark Office*